(12) United States Patent
Hosseini et al.

(10) Patent No.: US 8,581,371 B2
(45) Date of Patent: Nov. 12, 2013

(54) CONNECTION ELEMENT FOR A SEMICONDUCTOR COMPONENT AND METHOD FOR PRODUCING THE SAME

(75) Inventors: Khalil Hosseini, Weihmichl (DE); Joachim Krumrey, Goedersdorf (AT); Joachim Mahler, Regensburg (DE); Gerhard Noebauer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 337 days.

(21) Appl. No.: 11/489,720

(22) Filed: Jul. 20, 2006

(65) Prior Publication Data

US 2007/0018338 A1    Jan. 25, 2007

(30) Foreign Application Priority Data

Jul. 20, 2005    (DE) .......................... 10 2005 034 485

(51) Int. Cl.
*H01L 39/00* (2006.01)
(52) U.S. Cl.
USPC ............................ 257/663; 257/735; 257/737
(58) Field of Classification Search
USPC ......... 257/666, 667, 784, 684, 688, 663, 735, 257/737, 780
See application file for complete search history.

(56) References Cited

U.S. PATENT DOCUMENTS

| | | | |
|---|---|---|---|
| 4,719,317 A * | 1/1988 | Reynolds et al. ........... | 174/94 R |
| 4,907,734 A | 3/1990 | Conru et al. | |
| 5,633,204 A | 5/1997 | Tago et al. | |
| 6,110,823 A * | 8/2000 | Eldridge et al. ............. | 438/660 |
| 6,274,823 B1 * | 8/2001 | Khandros et al. ............ | 174/261 |
| 6,358,847 B1 | 3/2002 | Li et al. | |
| 6,787,392 B2 * | 9/2004 | Quah ............................ | 438/112 |
| 6,882,040 B2 * | 4/2005 | Hosoya ........................ | 257/699 |
| 6,940,184 B2 * | 9/2005 | Ueda et al. ................... | 257/790 |
| 6,972,496 B2 * | 12/2005 | Choi ............................. | 257/780 |
| 7,435,108 B1 * | 10/2008 | Eldridge et al. ................ | 439/81 |
| 2002/0024122 A1 * | 2/2002 | Jung et al. .................... | 257/666 |
| 2002/0113322 A1 * | 8/2002 | Terashima et al. ........... | 257/784 |
| 2003/0162330 A1 | 8/2003 | Aono et al. | |

FOREIGN PATENT DOCUMENTS

| | | |
|---|---|---|
| DE | 19703329 A1 | 8/1998 |
| DE | 102004042101 A1 | 3/2006 |
| JP | 55078536 A | 6/1980 |
| JP | 62219628 A | 9/1987 |
| JP | 06-291160 | * 10/1994 |
| JP | 06-0291160 | * 10/1994 |
| JP | 06291160 | * 10/1994 |
| WO | WO 2006/024261 A2 | 8/2005 |

* cited by examiner

*Primary Examiner* — Steven Loke
*Assistant Examiner* — Kimberly M Thomas
(74) *Attorney, Agent, or Firm* — Murphy, Bilak & Homiller, PLLC

(57) ABSTRACT

A connection element is arranged on a connection area of a semiconductor component. The connection element includes at least one bonding wire portion fixed on the connection area. The connection area is covered by an electrically conductive material, the fixed bonding wire portion being surrounded or embedded by the electrically conductive material.

15 Claims, 13 Drawing Sheets

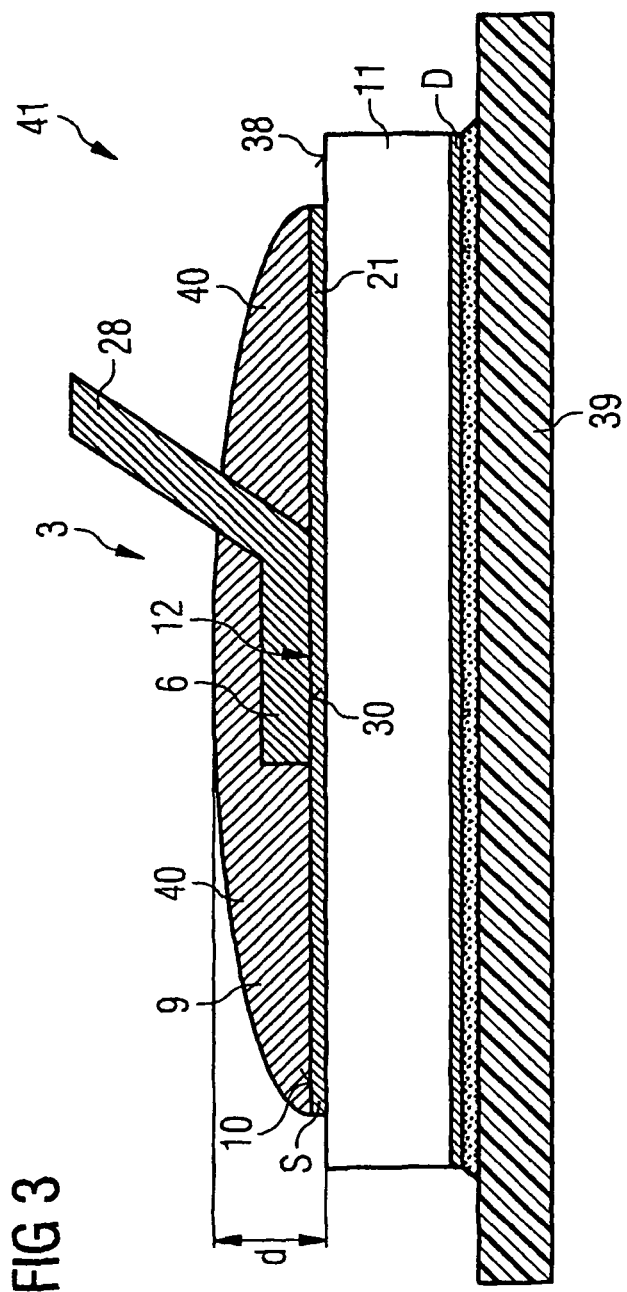

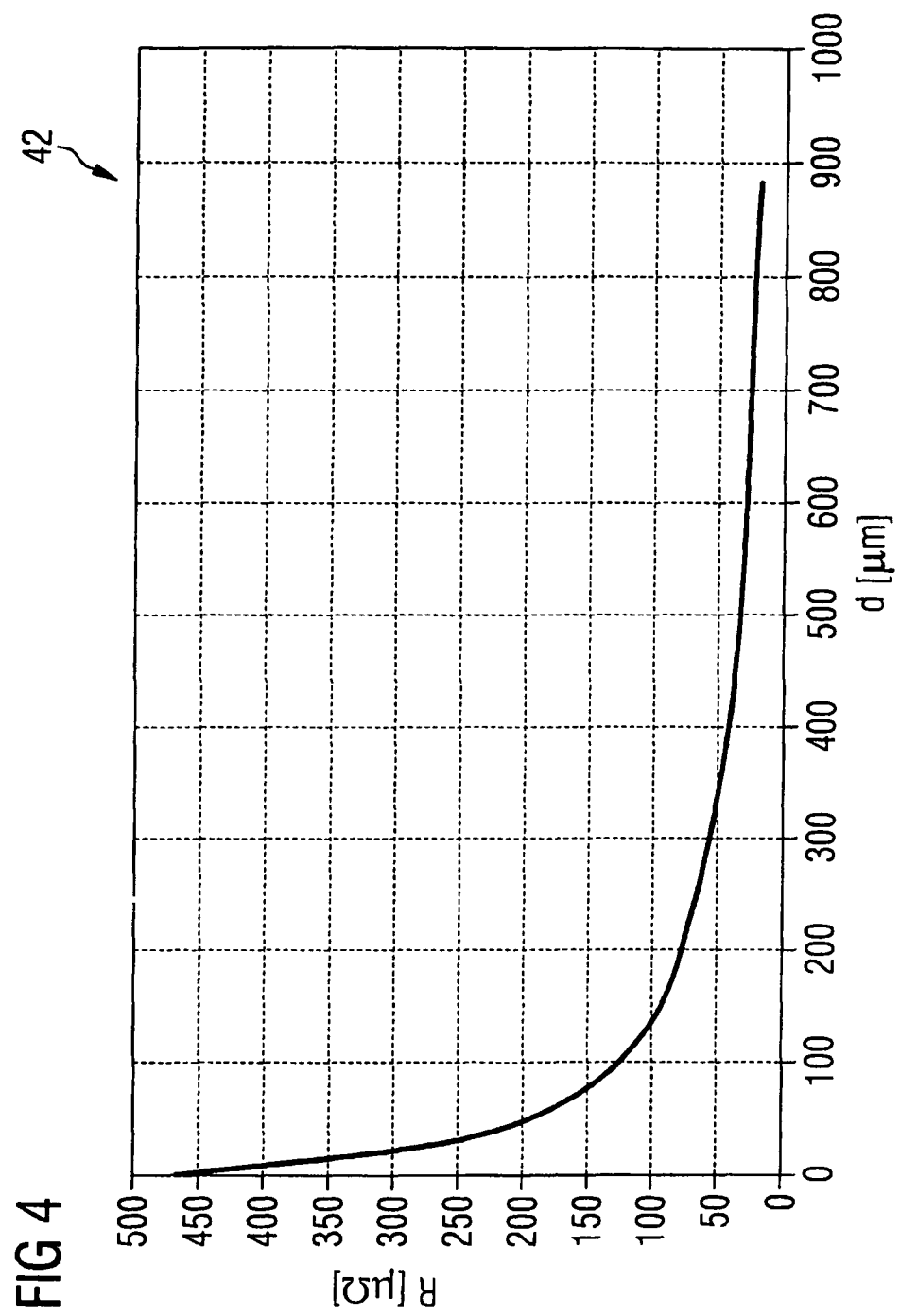

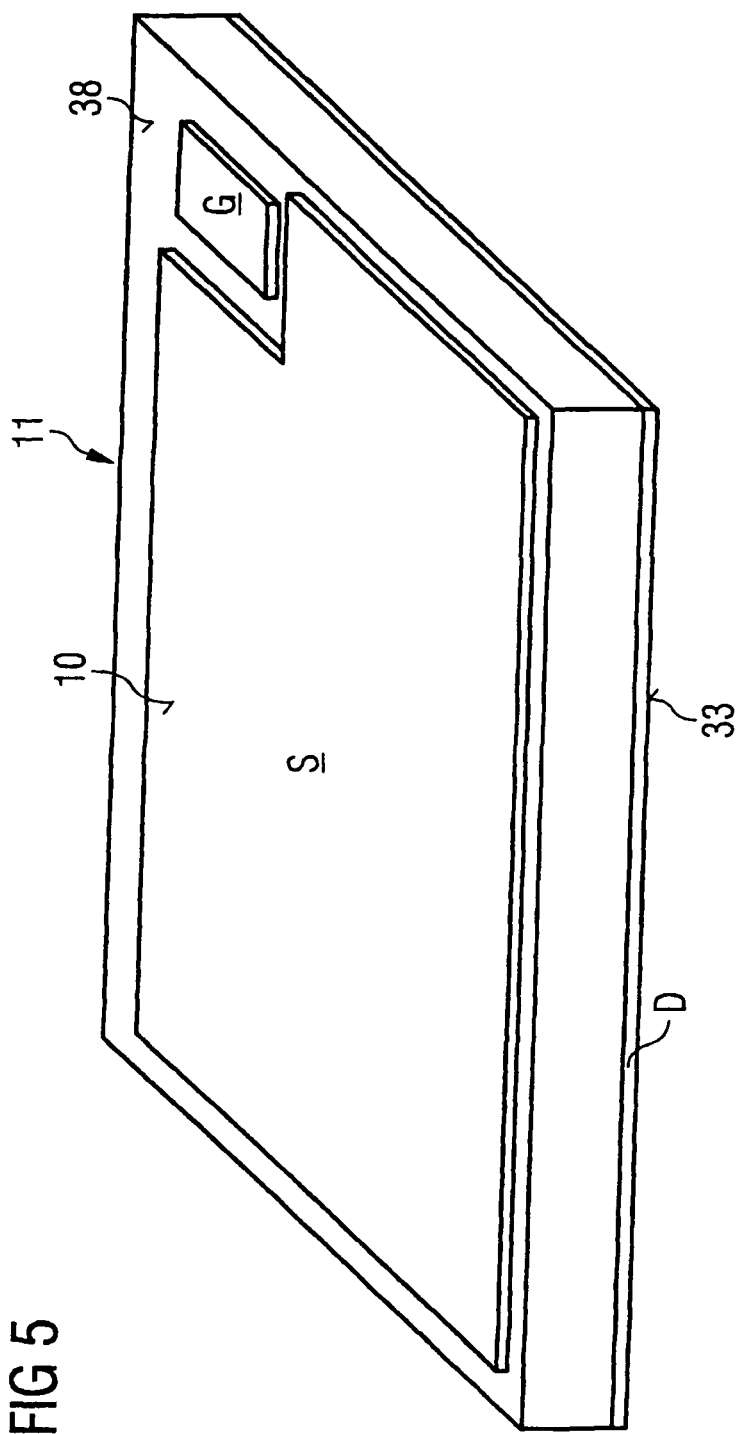

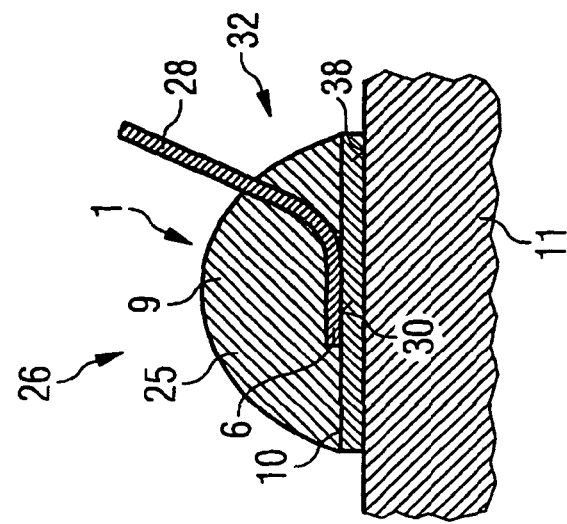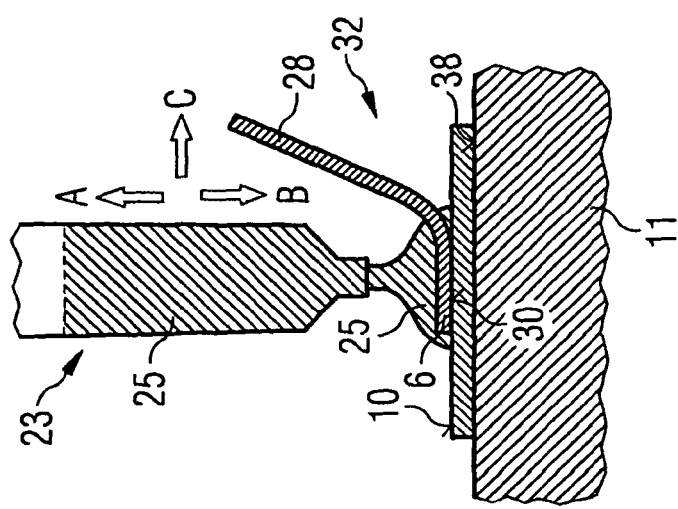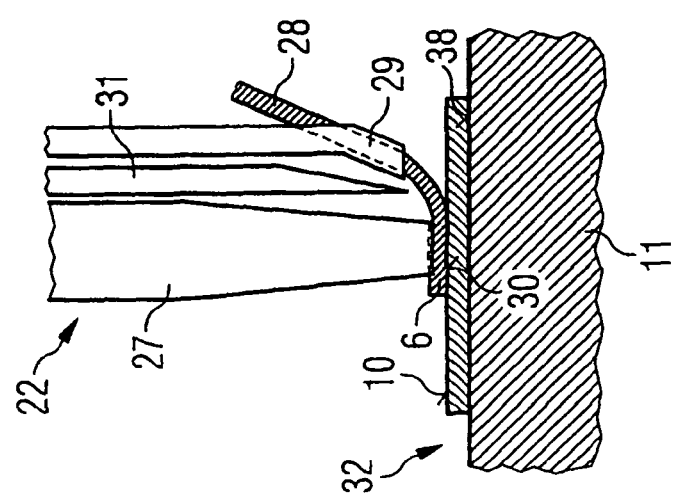

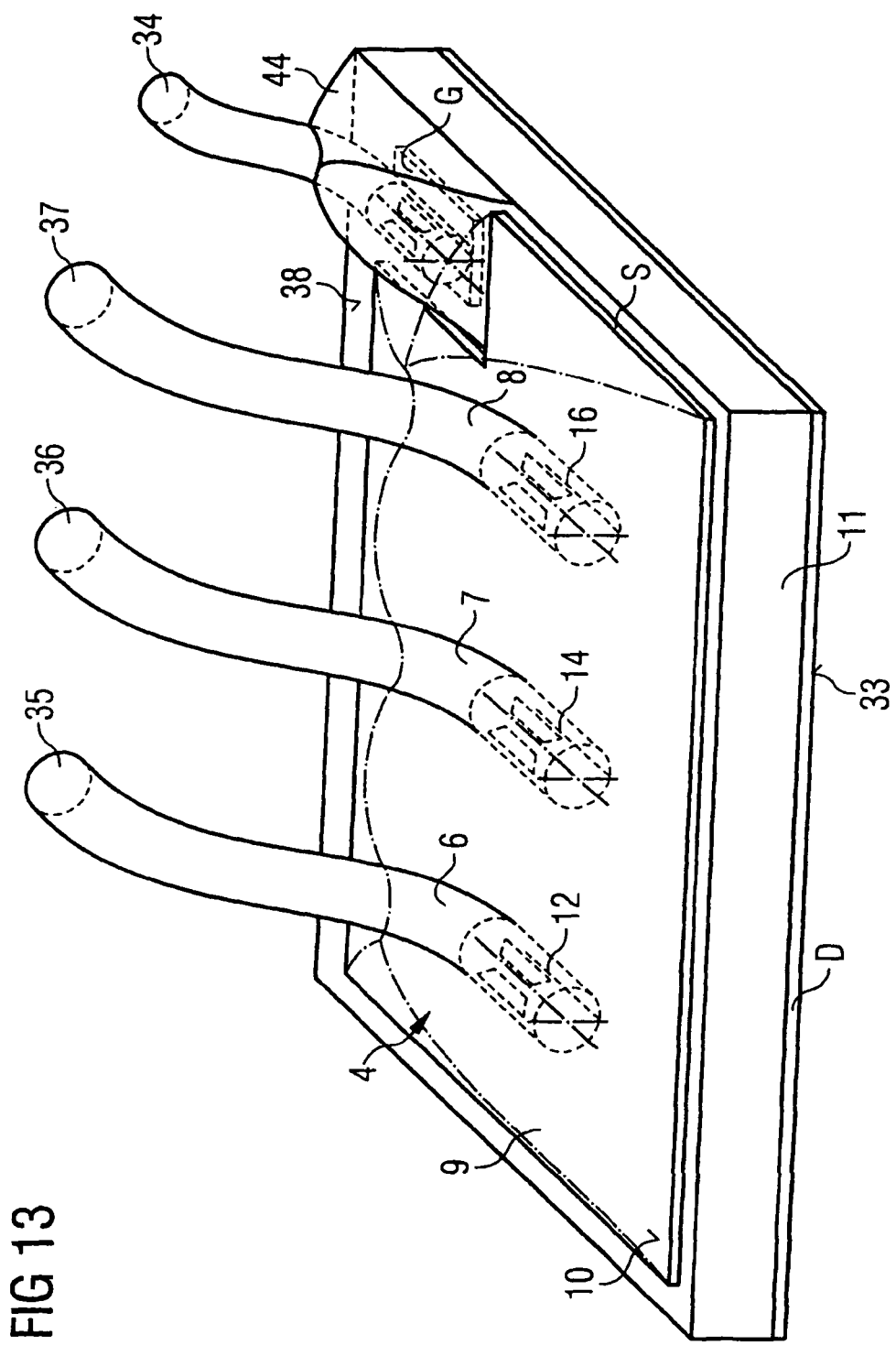

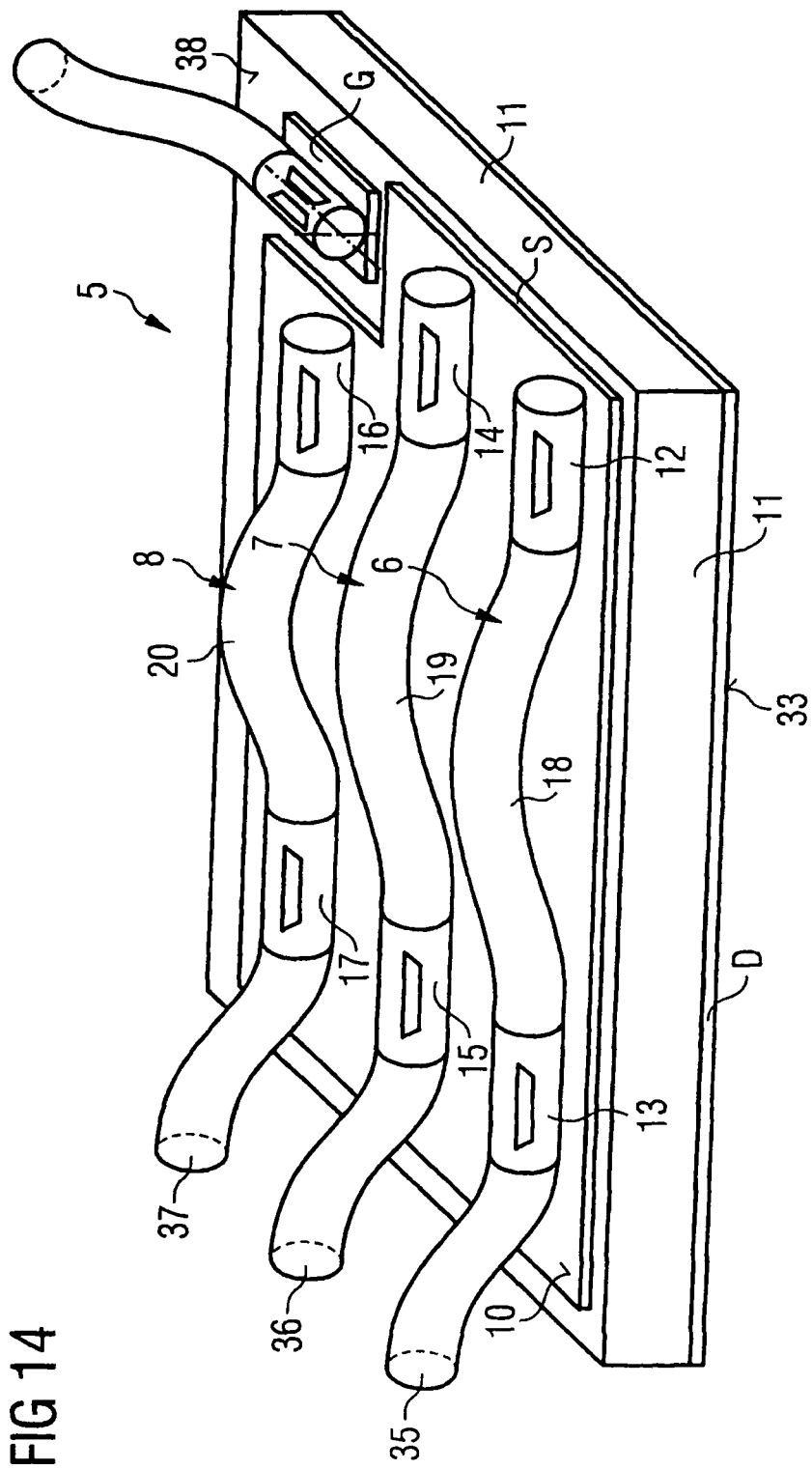

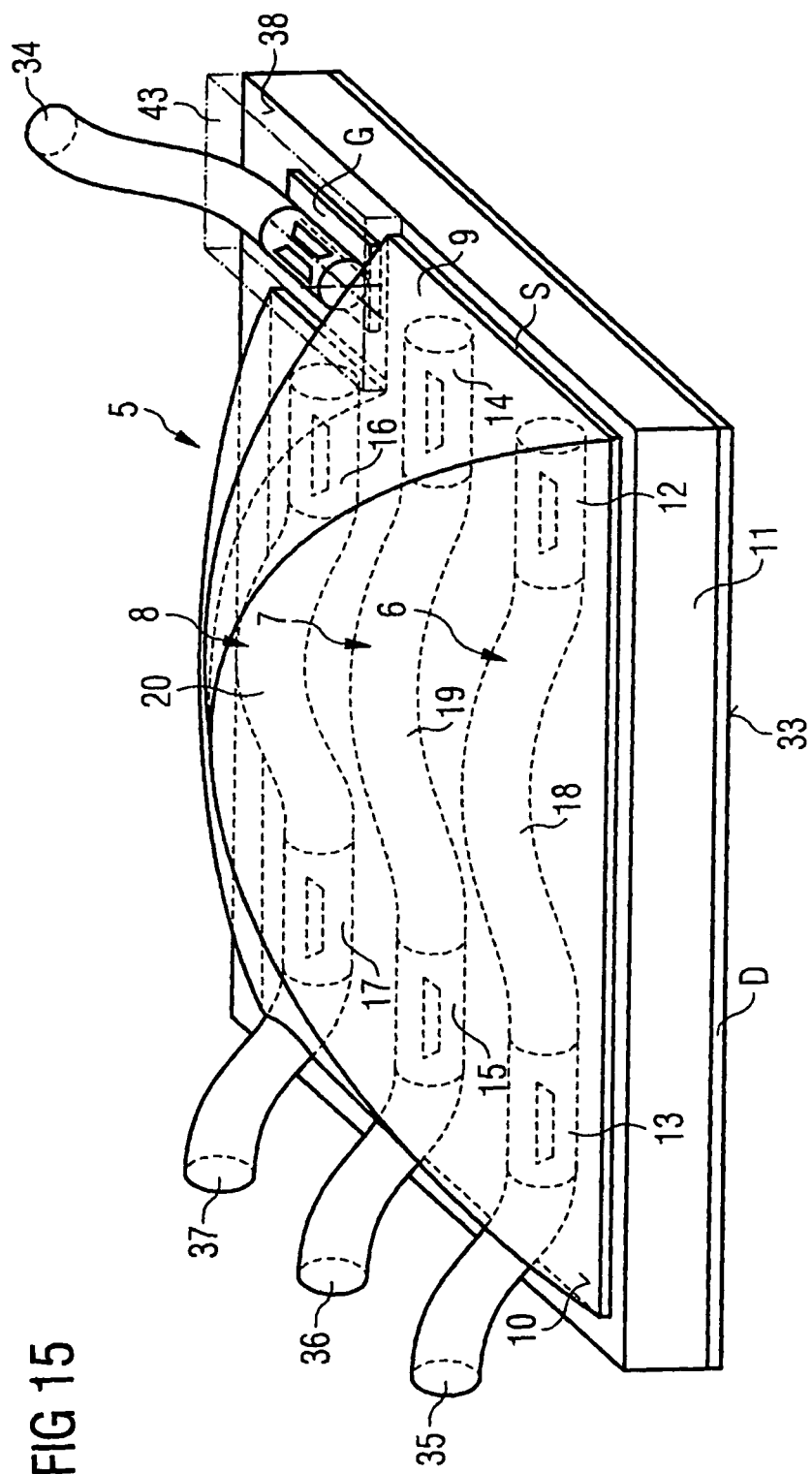

CONNECTION ELEMENT FOR A SEMICONDUCTOR COMPONENT AND METHOD FOR PRODUCING THE SAME

CROSS REFERENCE TO RELATED APPLICATIONS

This application claims priority under 35 U.S.C. §§119 and/or 365 to Application No. DE 102005034485.2 filed on Jul. 20, 2005, entitled "Connection Element for a Semiconductor Component and Method for Producing It," the entire contents of which are hereby incorporated by reference.

FIELD OF THE INVENTION

The invention relates to a connection element of a semiconductor component and to a semiconductor component having a connection element of this type, and also to a method for producing them.

BACKGROUND

In semiconductor power devices it is important for the conduction resistance to be minimized within a semiconductor device housing and for the current density to be distributed as uniformly as possible between corresponding connection elements. Nevertheless, it is not straightforwardly possible to achieve a homogeneous current distribution. Rather, complicated measures are necessary, for example in the case of the described connection element comprising a plurality of bonding wire portions, to combine the latter to form a large-area common bonding strip such that the bonding strip, via the connection elements, leads the high current flow to an external flat conductor or an external terminal of the high-power device. Currently, use is made of appropriately thick aluminum wires having a diameter of greater than 100 μm for controlling the high currents in order to allow currents of greater than 5 A to flow via corresponding connection elements.

For this purpose, a plurality of bonding wires can be applied to the active structures of a semiconductor power chip, above which the corresponding transistor circuits are situated. In this case, both a vertical current flow and a lateral current flow are crucial for the total connection resistance or the package resistance on the top side of the semiconductor chip in the case of aluminum bonding wire portions of this type. When there are large-area connection areas there is a problem with regard to the lateral current flow, which forms a limiting factor for the connection element, since the current-carrying capacity is limited by the thin metallization layer forming the connection area. The vertical component forms a lesser problem, since the thickness of the aluminum bonding wire is crucial here.

However, increasing the thickness of the metallization in the region of the connection area means that manufacturing is made more expensive for semiconductor production, the area of contact between the aluminum bonding wire and the connection area still not being enlarged, so that the areal limitation in the lateral direction still occurs at this point.

SUMMARY

A connection element for semiconductor power devices improves the lateral contact area connection without disregarding contact-making in the vertical direction. Specifically, a connection element is arranged on a connection area of a semiconductor component. The connection element comprises at least one bonding wire portion fixed on the connection area and a conductive material covering the connection area, the fixed bonding wire portion being embedded into the electrically conductive material or being surrounded by electrically conductive material.

The application of an electrically conductive material to a bonding wire portion is associated with the advantage that a connection element of this type constitutes a cost-effective solution for drastically reducing the lateral contact resistance at the corresponding bonding locations and for distributing the current flow homogeneously between the bonding wires proceeding from the connection element according to the invention.

A solder material or a metal paste is preferably used as the electrically conductive material. Moreover, the connection element preferably comprises at least one aluminum bonding wire portion or a bonding wire portion with alloys of aluminum. As mentioned above, it is possible to use bonding wires of this type with a significantly larger diameter than is customary for gold wires. In order, nevertheless, to reliably bond an aluminum bonding wire on an aluminum connection area, by way of example, it is advantageous if the connection element has a gold-coated aluminum bonding wire portion. In that case, in the event of thermosonic compression bonding or when fixing the bonding wedge portion on the connection area, a eutectic melt can form at low temperature between gold and aluminum.

Furthermore, it is preferably provided that the connection element is arranged on a contact area of a semiconductor chip, in particular of a semiconductor power chip.

Since the connection area is completely wetted by the metal paste or the solder of the connection element, and the bonding wire portion is embedded in the metal paste or the solder, no lateral problems arise since the current distribution is ensured in the lateral direction as well via the metal paste or the solder material.

In a further preferred embodiment of the invention, a plurality of bonding wire portions are arranged alongside one another on a large-area contact area and are jointly embedded by an electrically conductive material. This embodiment of the invention has the advantage that the bonding wire portions do not have to exactly comprise only the bonding wire wedge, rather the bonding wire portions merge into a bonding loop and are connected to contact pads of a higher-level leadframe. This means that it is possible to dispense with precise cutting to length of the bonding wire portions after the connection area, especially as the bonding wire portions merge into a bonding wire loop. In addition the application of the electrically conductive material is non-critical and need not be effected within a highly precise region, but rather may be distributed over the entire connection area.

In a further embodiment of the invention, the large-area connection area has a plurality of bonding wire portions arranged in a manner distributed uniformly alongside one another on a large-area electrode, the large-area electrode having the source electrode of a field effect power transistor or the cathode or anode of a power diode. Field effect semiconductor power devices of this type have a vertical current path from a bottom electrode to a top contact area situated on the top side of the semiconductor power chip, the current through the connection element according to the invention now being distributed homogeneously between the continuing bonding wires. These semiconductor components include IGBT structures, MOSFET structures, PIN diodes, or Schottky diodes. Whenever high currents are to be distributed homogeneously between bonding wires, the connection element according to the invention constitutes an advantageous solution.

An apparatus for producing a connection element includes a bonding apparatus with a bonding position and a position with a metal paste dispenser or a soldering device for applying a metal paste or a solder material to the fixed bonding wire portions for at least one connection element. A metal paste dispenser of this type may include a dispensing device. All that is crucial is that the dispensing device is integrated into the bonding sequence of the bonding device. It is furthermore preferred for the position which has a metal paste dispenser or soldering apparatus to be equipped with a metering apparatus which meters the amount of metal paste or the amount of solder, depending on the size of the connection element. This has the advantage that given optimum metering, the metal paste or the solder remains limited merely to the surface electrode with the bonding wire portions.

A further position is advantageously provided for the bonding device, in which a metal paste of the connection element can be cured by heating. A laser beam unit is preferably provided for the curing position, the laser beam of the laser beam unit heating the metal paste of the connection element such that volatile solvents escape and a sintering process commences for the binders contained in the metal paste, which sintering process leaves a dense sintering metal matrix on the connection area with the bonding portions being embedded.

A method for producing a connection element of the kind described above via an apparatus of the kind previously described includes the following operations. A connection area of a semiconductor component is oriented under a bonding stylus of the bonding device in a first bonding position. A bonding wire, preferably comprising an aluminum alloy, is inserted through a bonding wire feeding eye between bonding stylus and bonding area. This is followed by performing wire bonding with a bonding wire portion of the bonding wire.

After a bonding wire wedge has been formed on the connection area, the bonding wire is guided to a second bonding position and the bonding wire is bonded on a second connection area, and the bonding wire is separated via a separating stylus after a positively locking connection has been made between bonding wire end and the second connection area. If a plurality of bonding wires are to be applied, then it is also possible for a plurality of bonding wires to be fixed alongside one another on the connection area. Afterward, a metal paste is applied in a position of the bonding apparatus with a corresponding metal paste dispenser or a solder is applied to the bonding portions via a soldering device with the bonding wire portions being embedded into the metal paste or the solder.

This method has the advantage over other known methods that standard bonding wire bonding can be employed and only the corresponding bonding locations are embedded with a metal paste or a solder in order to improve the lateral conductivity of the bonding connections. For this purpose, the bonding wire may also be bonded multiply on the connection area before it is guided to the next bonding location. The metal paste may then be heated with the aid of a laser beam so that a solvent escapes and the metal particles of the metal paste sinter together to form an electrically conductive paste. In this case, a sintering temperature T is preferably set within a range of 100° C.≤T≤250° C.

To summarize, the contact area between the bonding wire and the connection area on the semiconductor power chip can be significantly increased via the connection element according to the invention. It is also possible, via a plurality of bonding wire portions, to bring about a more homogeneous current distribution and at the same time a reduction of the lateral current flow. The use of an electrically conductive paste after the bonding wire connections have been fitted on the connection areas of the semiconductor chip or the top side of the semiconductor power chips creates an additional homogeneous, conductive area around the bonding wire, and the contact area between bonding wire and connection area of the semiconductor top side is thus significantly increased, as a result of which the lateral current through-flow can be improved and increased. Further advantages of this connection element include the increase in the thermal conductivity on account of the electrically and thermally conductive particles in the metal paste, and the increase in the reliability of the wire terminal connection against stress and possible detachment of the wires by the corresponding molding composition.

The conductive paste or the solder material applied to the connection location simultaneously protects these connections from mechanical and thermal stresses and reduces the risk of detachment on account of mechanical loading by the housing molding composition to be introduced. This connection element does not have to be restricted only to the internal connections of a semiconductor device, but rather can also improve the current-carrying capacity of the connection to the internal flat conductors or to corresponding contact pads of corresponding wiring substrates by virtue of the fact that here as well, after the bonding of the bonding wire, these are embedded into a corresponding electrically conductive paste. Consequently, at this location, too, the thermal conductivity, the electrical conductivity and the mechanical stability and hence the reliability of the wire connection are increased significantly relative to conventional connection technologies.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures.

FIG. 3 shows a schematic cross section through a semiconductor power device with a connection element of a third embodiment of the invention.

FIG. 4 shows a diagram depicting the decrease in the spreading resistance as a function of the material thickness of the connection element.

FIGS. 5 to 9 show schematic views of the semiconductor power chip in accordance with FIG. 1 upon application of the connection element of the first embodiment of the invention.

FIG. 5 shows a schematic perspective view of the semiconductor power chip in accordance with FIG. 1.

FIG. 6 shows a schematic cross section through a partial region of the semiconductor chip upon application of a bonding wire portion in a bonding position.

FIG. 7 shows a schematic cross section through a partial region of the semiconductor power chip in accordance with FIG. 6 upon application of a metal paste in a metal paste position.

FIG. 8 shows a schematic cross section through the partial region of the semiconductor chip in accordance with FIG. 7 after curing of the metal paste in a curing position.

FIG. 9 shows a schematic perspective view of the semiconductor power chip in accordance with FIG. 5 after application of a plurality of bonding wire portions to a large-area connection area on the top side of the semiconductor power chip.

FIG. 13 shows a schematic perspective view of a semiconductor power chip with a connection element of a fourth embodiment of the invention.

FIG. 14 shows a schematic perspective view of a semiconductor power chip after application of bonding wire portions to a connection area of the semiconductor power chip in accordance with FIG. 5.

FIG. 15 shows a schematic perspective view of a semiconductor power chip with a connection element in accordance with a fifth embodiment of the invention.

DETAILED DESCRIPTION

Figure 1:
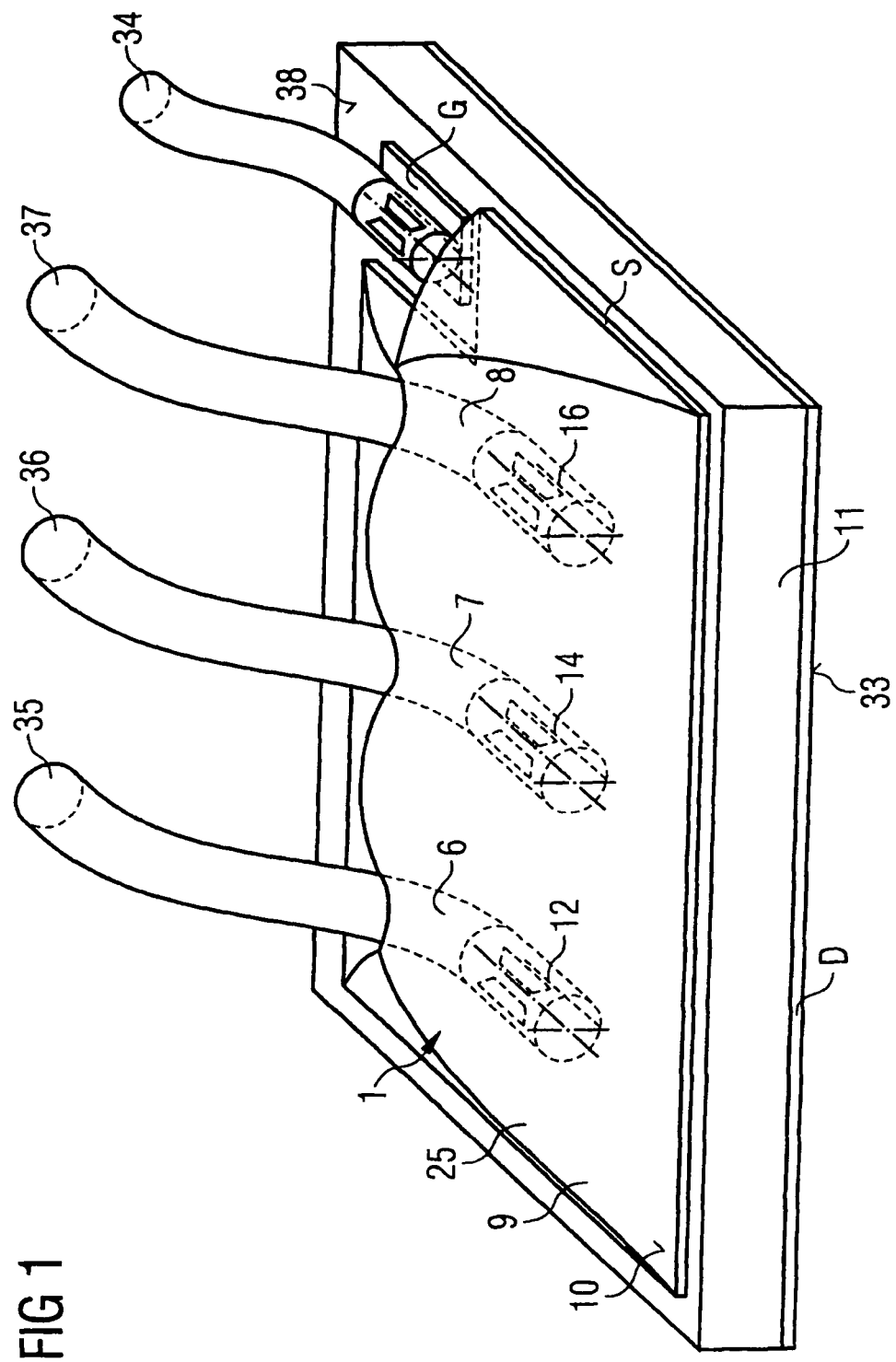
FIG. 1 shows a schematic perspective view of a semiconductor power chip with a connection element of a first embodiment of the invention.

FIG. 1 shows a schematic perspective view of a semiconductor power chip 11 with a connection element 1 of a first embodiment of the invention. The semiconductor power chip 11 is a vertical MOSFET (field effect transistor with a metal oxide silicon structure) having a large-area drain electrode D on its underside 33 and having a large-area source electrode S and a smaller gate electrode G on its top side 38. The vertical current path from the drain electrode D to the source electrode S is conducted via the connection element 1 according to the invention to a source external contact (not illustrated in FIG. 1). Moreover, via a gate bonding wire 34, switching signals are applied to the semiconductor power chip 11 via the gate electrode G.

Bonding wire portions 6, 7 and 8 are arranged in fixed positions 12, 14 and 16 on a large-area connection area 10, the area of contact in the fixed positions 12, 14 and 16 of the bonding wires 35, 36 and 37 being comparatively small compared with the areal extent of the connection area 10. Since the thickness of the associated connection layer of the connection area 10 is extremely small, a problem arises for the current distribution to the three bonding wires 35, 36 and 37, the problem being solved by the fact that the fixed bonding portions 6, 7 and 8 are embedded into a metal paste 25, the metal paste 25, as electrically conductive material 9, covering the entire connection area 10. Consequently, in the case of this connection element 1, the lateral resistance is also minimized and an optimum and virtually homogeneous current distribution among the three bonding wires 35, 36 and 37 is ensured.

Figure 2:
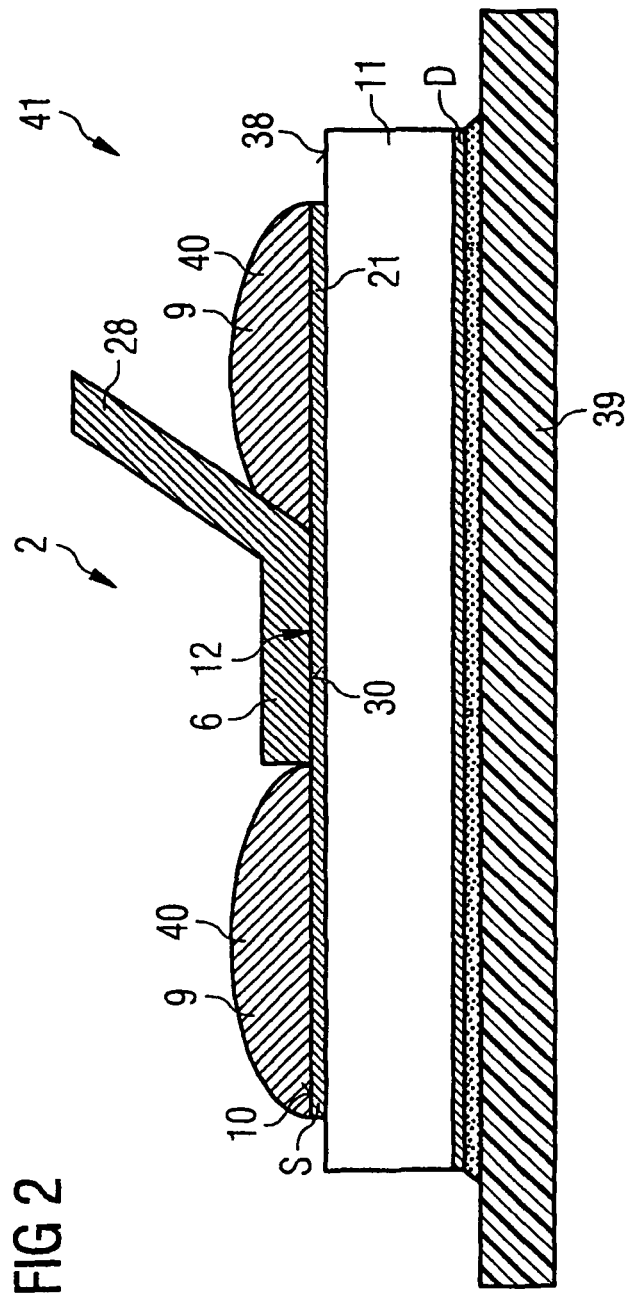
FIG. 2 shows a schematic cross section through a semiconductor power device with a connection element of a second embodiment of the invention.

FIG. 2 shows a schematic cross section through a semiconductor power device 41 with a connection element 2 of a second embodiment of the invention. Components having functions identical to those in FIG. 1 are identified by identical reference symbols and are not explained separately.

In this case, for rectifying the problem of the lateral current distribution, the connection element 2 has an additional solder material 40 as electrically conductive material 9 on the connection area 10, which material surrounds the bonding wire portion 6 fixed on the bonding area 30. This additional contact material 40 reinforces the thickness of the large-area electrode 21, which represents a source electrode S for this semiconductor power device 41. In this embodiment of the invention, the semiconductor power chip 11 is fixed on a leadframe 39 by its drain electrode D.

FIG. 3 shows a schematic cross section through the semiconductor power device 41 from FIG. 2 with a connection element 3 of a third embodiment of the invention. Components having functions identical to those in the previous figures are identified by identical reference symbols and are not explained separately.

The third embodiment of the connection element 3 differs from the second embodiment in accordance with FIG. 2 by the fact that the bonding wire portion 6 fixed on the bonding area 30 is completely embedded into a solder material 40, with the result that here it is possible to achieve an optimum current distribution which can be forwarded via the bonding wire 28 to an external contact of the semiconductor power device 41.

FIG. 4 shows a diagram depicting the decrease in the spreading resistance R in μΩ as a function of the solder thickness d in μm shown in FIG. 3. This diagram 42 illustrates the influence exerted by the lateral resistance of a thin connection area if it is assumed that the layer thickness for the connection area is in the μm range. The diagram furthermore illustrates the more than proportional decrease in the spreading resistance R, if the thickness d of the connection element is hundreds of μm.

FIGS. 5 to 9 show schematic views of the semiconductor power chip 11 in accordance with FIG. 1 upon application of the connection element 1 of the first embodiment of the invention. For this purpose, the semiconductor power chip 11 has a source electrode S on the top side 38 and a drain electrode D on the rear side 33 of the semiconductor power chip 11. Furthermore, situated on the top side 38 is another small electrode in the form of the gate electrode G for the semiconductor power chip 11.

FIG. 6 shows a schematic cross section through a partial region 32 of the semiconductor power chip 11 upon application of a bonding wire portion 6 in a bonding wire position 22 of a bonding apparatus. For this purpose, the bonding wire 28 is guided through the bonding wire feeding eye 29 under the bonding stylus 27 and the bonding wire portion 6 is fixed on the bonding area 30 via a thermosonic compression process. The separating stylus 31 is not activated until the bonding wire 28 and the bonding stylus 27 have reached the second bonding position after the formation of a bonding loop within the semiconductor power device.

FIG. 7 shows a schematic cross section through the partial region 32 of the semiconductor power chip 11 in accordance with FIG. 6 upon application of a metal paste 25 in a metal paste position 23. In this implementation of the method, a metal paste 25 is applied rather than a solder, which metal paste may be fed from a metal paste dispenser 24, the metal paste dispenser 24 being movable in arrow directions A, B and C in order to cover the entire connection area 10 with the metal paste 25 and at the same time to embed the bonding wire portion 6 in the metal paste once the bonding wire 28 has already been fixed.

FIG. 8 shows a schematic cross section through the partial region 32 of the semiconductor power chip 11 in accordance with FIG. 7 after the metal paste 25 has cured to form an electrically conductive material 9. For this purpose, the connection element 1 is heated to a temperature T where $100°\,C. \leq T \leq 250°\,C$.

Figure 9:
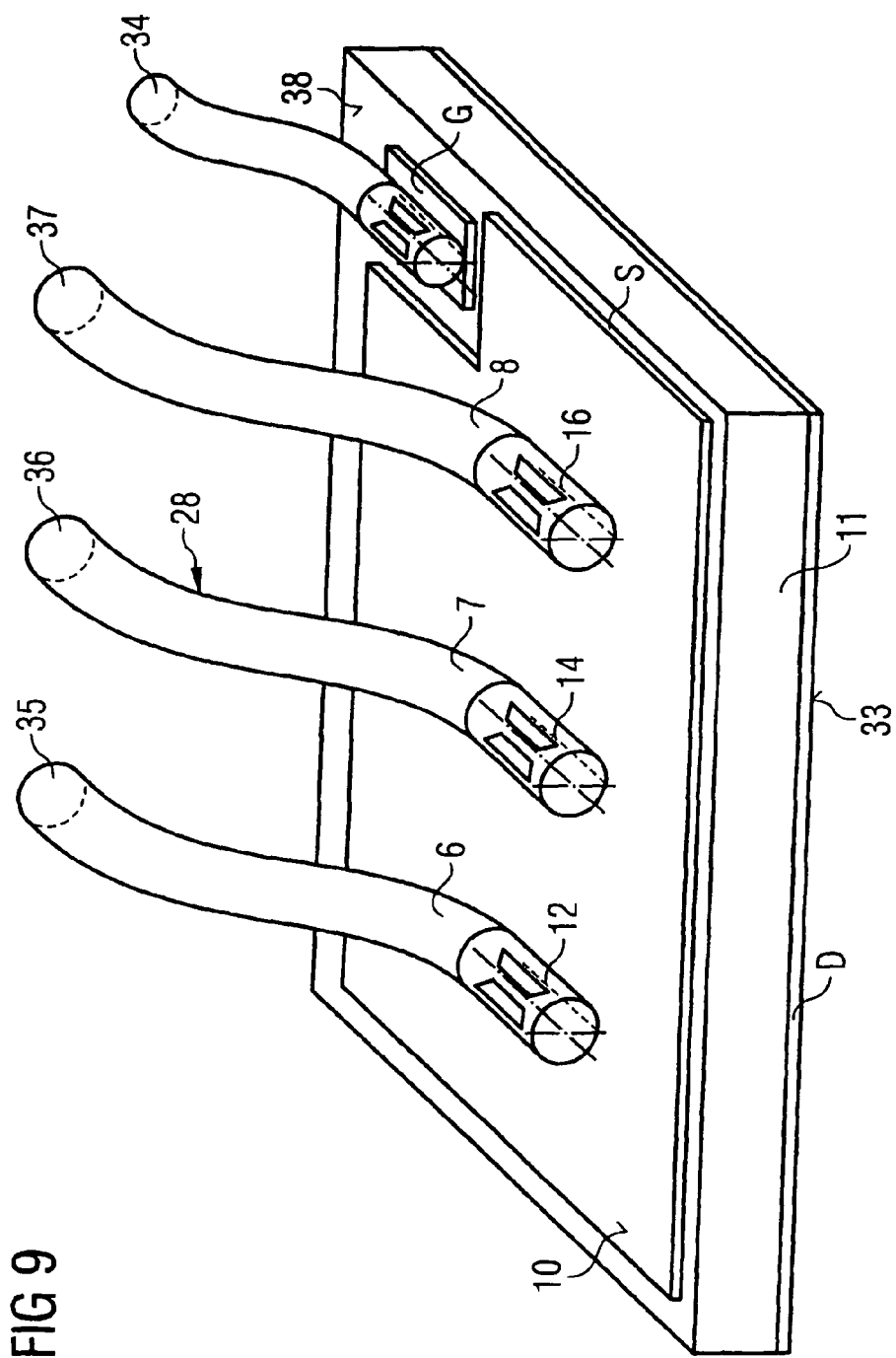

FIG. 9 shows a schematic perspective view of the semiconductor power chip 11 in accordance with FIG. 5 after application of a plurality of bonding wire portions 6, 7 and 8 on a common large-area connection area 10 on the top side 38 of the chip. In the fixed positions 12, 14 and 16 of the bonding wire portions 6, 7 and 8, the areas of contact of the bonding wire portions 6, 7 and 8 are extremely small in comparison with the areal extent of the connection area 10 so that the lateral current distribution is extremely critical in this state of the semiconductor power device. This is shown in FIG. 10.

Figure 10:
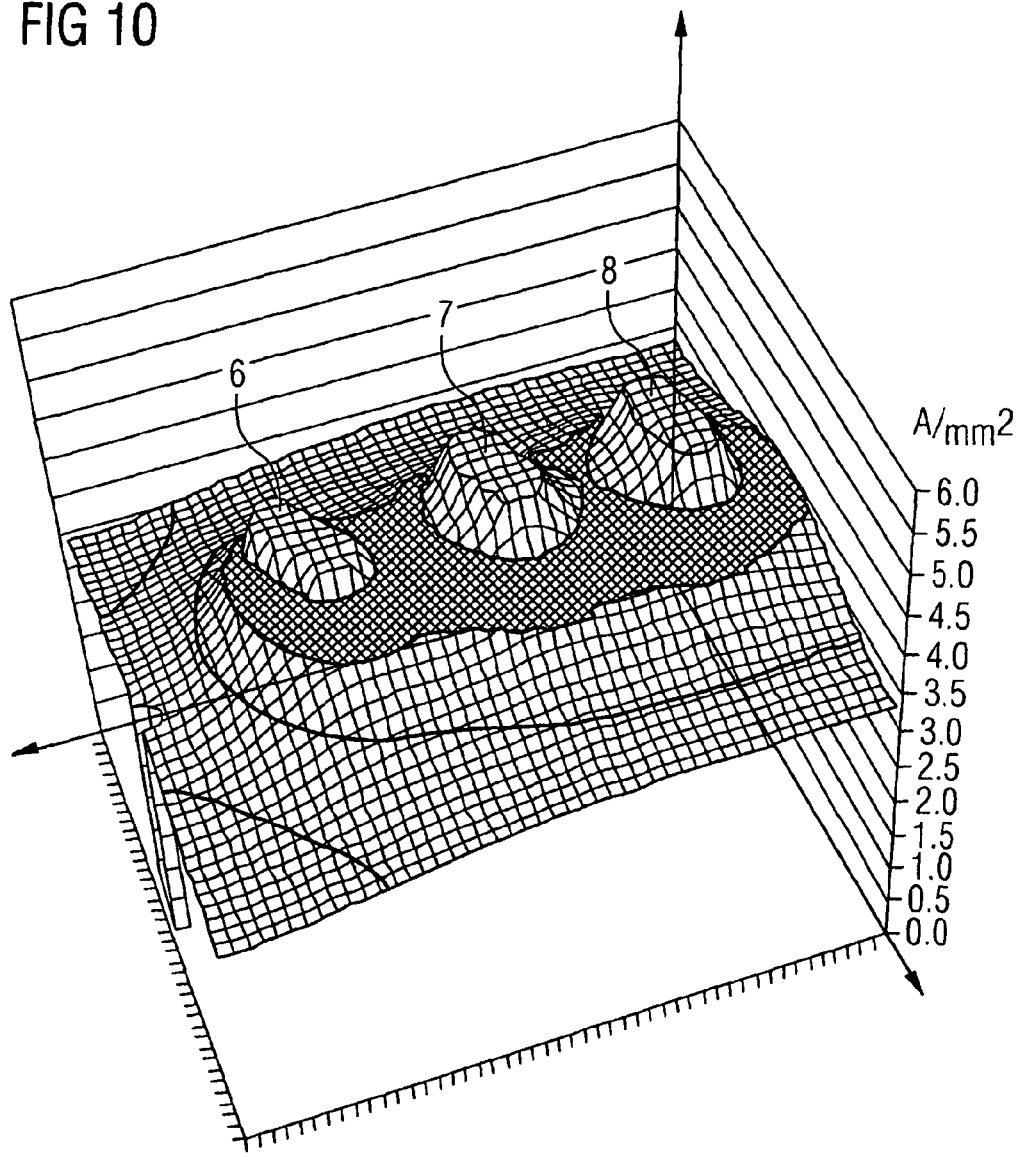
FIG. 10 shows a basic diagram depicting the current density distribution in A/mm$^2$ for the arrangement shown in FIG. 9 of the contact-making of bonding wire portions without embedding of the electrically conductive material.

FIG. 10 shows a basic diagram depicting the current density distribution in $A/mm^2$ for the arrangement shown in FIG. 9 of the contact-making of three bonding wire portions 6, 7 and 8 without the bonding wire portions being embedded into an electrically conductive material. It can clearly be discerned here that the vertical current density distribution through the three bonding wires is already relatively high, while a significantly lower current density can be achieved distributed over the connection area. For this purpose, a DMOS semiconductor power chip in a TO263-33 package for the voltage class of 40 V was investigated as a concrete exemplary embodiment. For a maximum on resistivity $R_{on}*A$ of 25 m$\Omega$ mm$^2$ given a gate voltage of 10 V and an active chip area of 27 mm$^2$, it is possible, with the conventional contact-making via bonding wires as shown in FIG. 9, to realize a maximum on resistance $R_{on}$ of the device of 1.9 m$\Omega$, including a spreading resistance of 316 $\mu\Omega$, a resistance of the bonding wires of 308 $\mu$m and a resistance of the terminal legs of 201 $\mu\Omega$.

In this case, the calculation of the spreading resistance is based on a top side metallization for the source electrode comprising aluminum having a thickness of 5 $\mu$m, with which contact is made once in each case by three aluminum bonding wires having a diameter of 500 $\mu$m, as can be seen in FIG. 9. The requirement for restricting the temperature of the bonding wires to a maximum of 220° C. results in a maximum continuous drain current of 10 A for this configuration. The calculated current density distribution can be seen in FIG. 10.

Figure 11:
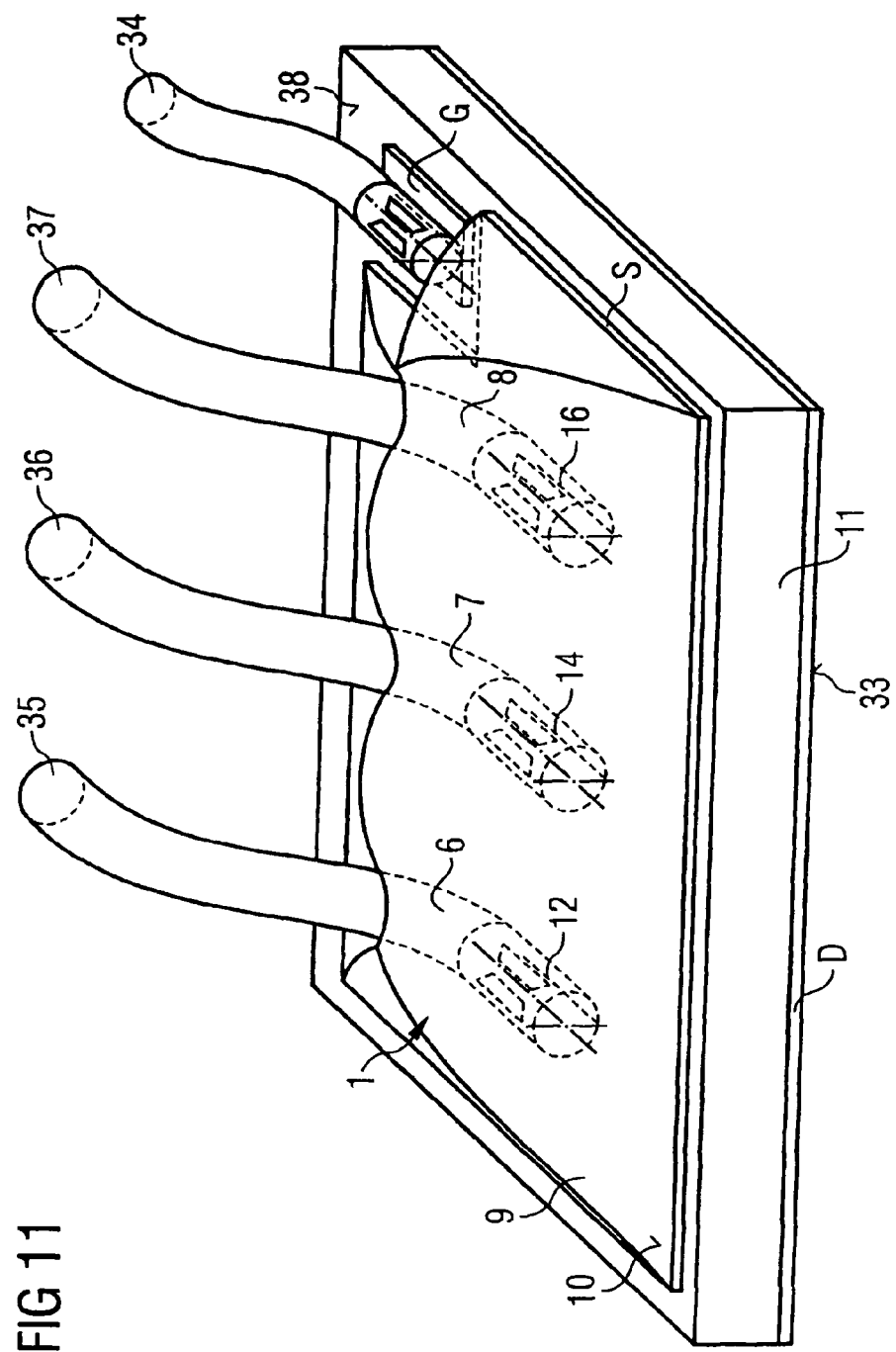
FIG. 11 shows a schematic perspective view of the semiconductor power chip in accordance with FIG. 9 after the bonding wire portions have been embedded into an electrically conductive material.

FIG. 11 shows a schematic perspective view of the semiconductor power chip in accordance with FIG. 9 after the bonding wire portions 6, 7 and 8 have been embedded into an electrically conductive material 9. FIG. 11 thus corresponds to the original FIG. 1.

Figure 12:
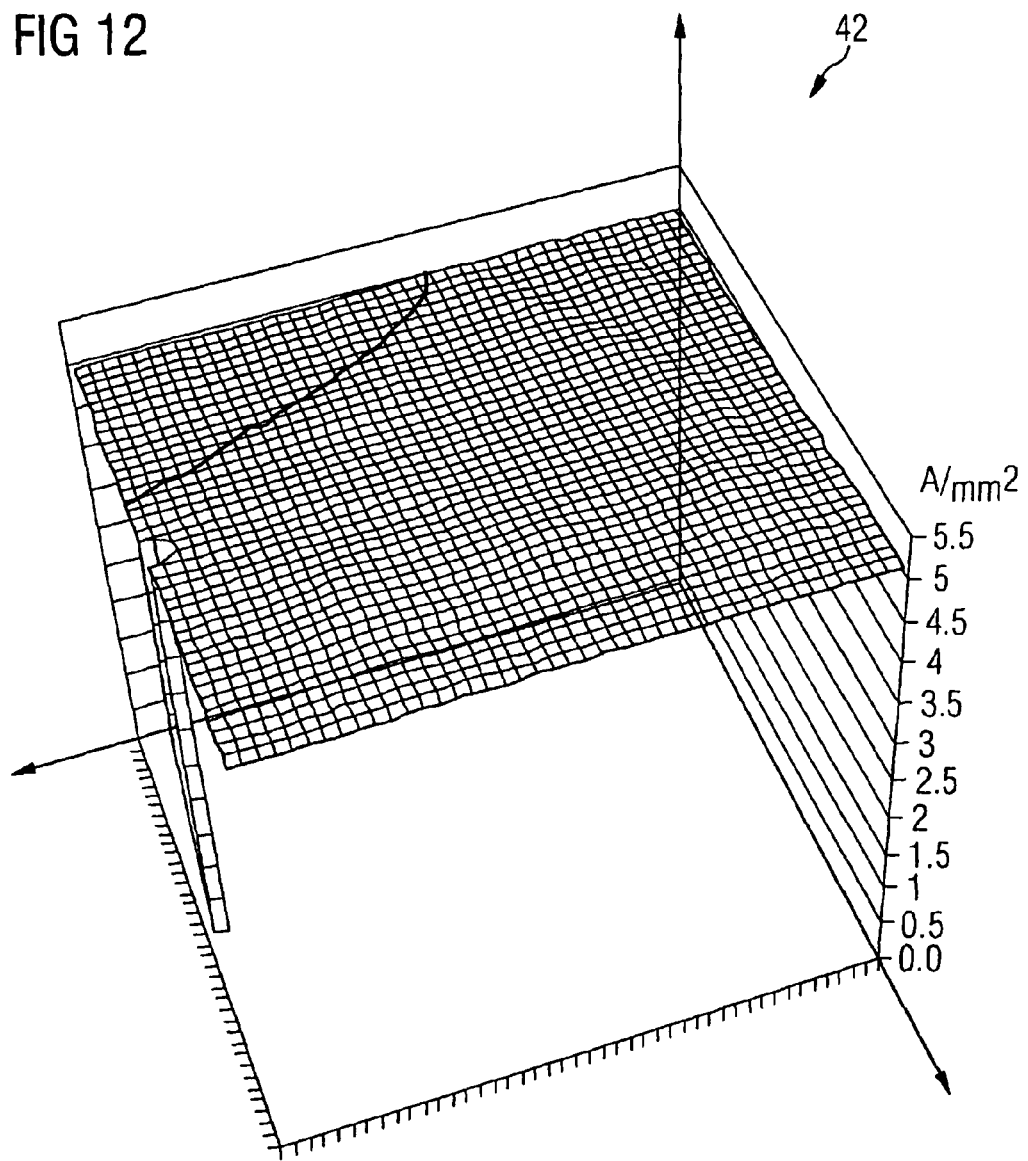
FIG. 12 shows a basic diagram depicting the current density distribution in A/mm$^2$ after the connection area has been reinforced with a 500 μm thick solder layer as electrically conductive material to form a connection element.

FIG. 12 shows a basic diagram 42 depicting the current density distribution in $A/mm^2$ after reinforcement of the connection area 10 with a 500 $\mu$m thick, electrically conductive layer 9 to form a connection element. In the case of the connection element according to the invention as shown in FIG. 11, the semiconductor power chip is likewise contact-connected via three 500 $\mu$m thick bonding wires and a solderable connection area 10 is subsequently reinforced by a solder layer having a thickness of 500 $\mu$m for this calculation and having a resistivity of 17 $\mu\Omega$cm. By virtue of the significantly larger metallization thickness, the spreading resistance is only 30 $\mu\Omega$ in that case.

In addition, without any disadvantage in terms of the spreading resistance, the bonding wires may also, if necessary be arranged at the edge of the source electrode, used as connection area 10 here, and the bonding wires can thus also be kept shorter, so that the resistance of the bonding wires then amounts to only 241 $\mu\Omega$. For the same maximum on resistance $R_{on}$ of the device of 1.9 m$\Omega$, only an active chip area of 19.6 mm$^2$ is therefore required, which corresponds to a gain in area of 27%. At the same time, owing to the shorter wire length, the maximum continuous drain current rises to 120 A and can thus be amplified by 20%. By virtue of the larger contact area, the current density distribution is more homogeneous, as shown in FIG. 12, and higher current densities do not arise despite the smaller active area given the same drain current.

FIG. 13 shows a schematic perspective view of a semiconductor power chip 11 with a connection element 4 of a fourth embodiment of the invention. Components having functions identical to those in previous figures are identified by identical reference symbols and are not explained separately. The difference from the embodiments of the invention discussed previously is that the gate electrode is protected by an insulating material 44 for protection against the electrically conductive material 9 applied to the source electrode S. The insulating material 44 is applied for the application of the electrically conductive material 9.

FIG. 14 shows a schematic perspective view of a semiconductor power chip 11 after application of bonding wire portions 6, 7 and 8 to a connection area 10 of the semiconductor power chip 11 in accordance with FIG. 5. Components having functions identical to those in previous figures are identified by identical reference symbols and are not explained separately. The difference from the previous embodiments of the connection element is that here the bonding wires 35, 36 and 37 for the source electrode S are fixed on the source electrode not just at one bonding location, but at two locations in each case. Thus, the bonding wire 35 is fixed in both positions 12 and 13, the bonding wire 36 is fixed in positions 14 and 15 and the bonding wire 37 is fixed in positions 16 and 17. Between the two positions, the three bonding arcs 18, 19 and 20 respectively result for the bonding wire portions 6, 7 and 8. By virtue of the fact that the bonding positions 13, 15 and 17 are arranged close to the edge of the semiconductor power chip, the bonding wires 35, 36 and 37 to the external contact areas disposed downstream can be significantly shortened, which in turn reduces the spreading resistance already discussed above.

FIG. 15 shows a schematic perspective view of a semiconductor power chip 11 with a connection element 5 in accordance with the fifth embodiment of the invention. This connection element 5 was prepared by specifically fitting the bonding wires 35, 36 and 37 as shown in FIG. 14. The bonding wire portions 6, 7 and 8 shown in FIG. 14 are then embedded into a common electrically conductive material 9, which may be a solder material and also a metal paste, in which case, for a solder material, the gate electrode G with the bonding wire 34 can be protected against being wetted by solder material by means of a soldering resist layer 43.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

1 Connection element (1st embodiment)
2 Connection element (2nd embodiment)
3 Connection element (3rd embodiment)
4 Connection element (4th embodiment)

5 Connection element (5th embodiment)
6 Bonding wire portion
7 Bonding wire portion
8 Bonding wire portion
9 Electrically conductive material
10 Connection area
11 Semiconductor power chip
12, 13 Fixed positions
14, 15 Fixed positions
16, 17 Fixed positions
18 Bonding arc
19 Bonding arc
20 Bonding arc
21 Large-area electrode
22 Bonding position
23 Metal paste position
24 Metal paste dispenser
25 Metal paste
26 Curing position
27 Bonding stylus
28 Bonding wire
29 Bonding wire feeding eye
30 Bonding area
31 Separating stylus
32 Partial region of the semiconductor power chip
33 Rear side of the semiconductor power chip
34 Gate bonding wire
35 Source bonding wire
36 Source bonding wire
37 Source bonding wire
38 Top side of the semiconductor power chip
39 Leadframe
40 Solder material
41 Semiconductor power device
42 Diagram
43 Soldering resist layer
44 Insulating material
A Arrow direction
B Arrow direction
C Arrow direction
D Drain electrode
d Thickness of the connection element
G Gate electrode
R Spreading resistance
S Source electrode

What is claimed is:

1. A connection element arranged on a connection area of a semiconductor component, the connection element comprising:
   a plurality of bonding wires respectively comprising bonding wire portions in direct contact with the connection area at a respective plurality of fixed positions, each of the fixed positions extending in a line along a surface of the connection area such that each bonding wire portion is fixed on the connection area with its longitudinally extending surface lying against the line of a respective one of the fixed positions, the bonding wire portions respectively comprising portions of bonding wires that have no more than one end in direct contact with the connection area; and
   a common conductive layer comprising an electrically conductive material covering substantially an entirety of the connection area, wherein the bonding wire portions are substantially completely surrounded by and/or substantially completely embedded in the common conductive layer such that the contact resistance of the connection element is lowered, and wherein the bonding wires extend out of the common conductive layer,
   wherein the connection area comprises a large-area electrode comprising a source electrode of a power transistor or a cathode of a power diode.

2. The connection element as claimed in claim 1, wherein the electrically conductive material is a metal paste.

3. The connection element as claimed in claim 1, wherein the electrically conductive material is a solder material.

4. The connection element as claimed in claim 1, wherein the bonding wire portions comprise aluminum or alloys of aluminum.

5. The connection element as claimed in claim 1, wherein the bonding wire portions comprise a gold-coated aluminum bonding wire portion.

6. The connection element as claimed in claim 1, wherein the connection element is arranged on a contact area of a semiconductor chip.

7. The connection element as claimed in claim 1, wherein the connection area comprises a large-area contact area, and wherein the bonding wire portions are arranged alongside one another on the large-area contact area and are jointly embedded by the electrically conductive material.

8. The connection element as claimed in claim 1, wherein the electrically conductive material comprises an electrically conductive paste or a solder material, and wherein the bonding wire portions include a bonding arc between the fixed positions, the bonding arc and regions of the bonding wire portions secured to the connection area being embedded by the electrically conductive material arranged on the connection area.

9. The connection element as claimed in claim 1,
   wherein the bonding wire portions are distributed uniformly alongside one another on the large-area electrode.

10. A semiconductor component comprising at least one connection element as claimed in claim 1.

11. The connection element of claim 1, wherein the bonding wire portions are distributed uniformly alongside one another.

12. The connection element of claim 11, wherein the fixed positions are spaced apart and distributed across the surface of the connection area.

13. The connection element of claim 1, wherein an area of contact between the bonding wire portions and the fixed positions is substantially smaller than an areal extent of the connection area.

14. The connection element of claim 1, wherein the respective plurality of fixed positions, the bonding wire portions, and the common conductive layer are arranged and configured to provide a reduction in lateral contact resistance at the respective plurality of fixed positions and to distribute the current flow homogeneously among the bonding wire portions.

15. The connection element as claimed in claim 1, wherein the plurality of fixed positions extend in parallel lines along the surface of the connection area.

* * * * *